Nov. 10, 1970 J. P. VINDING ET AL 3,539,946

SOLID STATE WIDE BAND MICROWAVE VOLTAGE CONTROLLED OSCILLATOR
WITH IMPROVED FREQUENCY MODULATION CAPABILITY
Filed Dec. 28, 1966

JOSEPH J. DIGIOVANNI
THOMAS D. LUSK &
JORGEN P. VINDING
INVENTORS

BY George C. Sullivan
AGENT

United States Patent Office 3,539,946

Patented Nov. 10, 1970

3,539,946

SOLID STATE WIDE BAND MICROWAVE VOLTAGE CONTROLLED OSCILLATOR WITH IMPROVED FREQUENCY MODULATION CAPABILITY

Jorgen P. Vinding, Monte Sereno, Joseph J. Digiovanni, Mountain View, and Thomas D. Lusk, Sunnyvale, Calif., assignors to Lockheed Aircraft Corporation, Burbank, Calif.

Filed Dec. 28, 1966, Ser. No. 605,315

Int. Cl. H03b *5/12;* H03c *3/16*

U.S. Cl. 332—16 6 Claims

ABSTRACT OF THE DISCLOSURE

A high frequency transistor is mounted in a strip-transmission line resonator circuit. Modulation is accomplished by varying the collector B+ voltage with a modulating signal. To obtain the proper output frequency, the operating frequency of the oscillator is doubled by the nonlinear junction capacitance of the transistor, and the fundamental frequency and all other harmonics are suppressed by the strip line bandpass filter tuned to the second harmonic of the oscillator frequency.

The impending need for the increased information bandwidth in missile, space and satellite communication systems is demanding new developments in transmitter design. Communication systems capable of receiving and transmitting information contained in a 50-megacycle base band are required. In the past, the requirement for a wideband communication system may have been present, but this frequency requirement remained academic since techniques were not available to develop a practical system. By utilizing a solid state wideband microwave voltage controlled oscillator of the present invention, it is possible to extend the bandwidth capabilities of UHF and SHF FM signal sources. This type of source coupled with a high gain traveling wave tube amplifier, results in a transmitter satisfactory for many of the present day needs and requirements for S-band and X-band transmitters.

The object of this invention is to provide a voltage controlled oscillator with extended bandwidth capabilities of ultra high frequency and super high frequency FM signal sources.

Another object of the present invention is to provide the voltage controlled oscillator capable of higher modulation rates and wider frequency deviations then was heretofore possible.

Another object of the present invention is to provide a voltage controlled oscillator which has more reliability and a greater life span then was heretofore possible.

Still another object of the present invention is to provide a voltage controlled oscillator that occupies a very small space, consumes very little power, and is relatively inexpensive.

Figure 1:
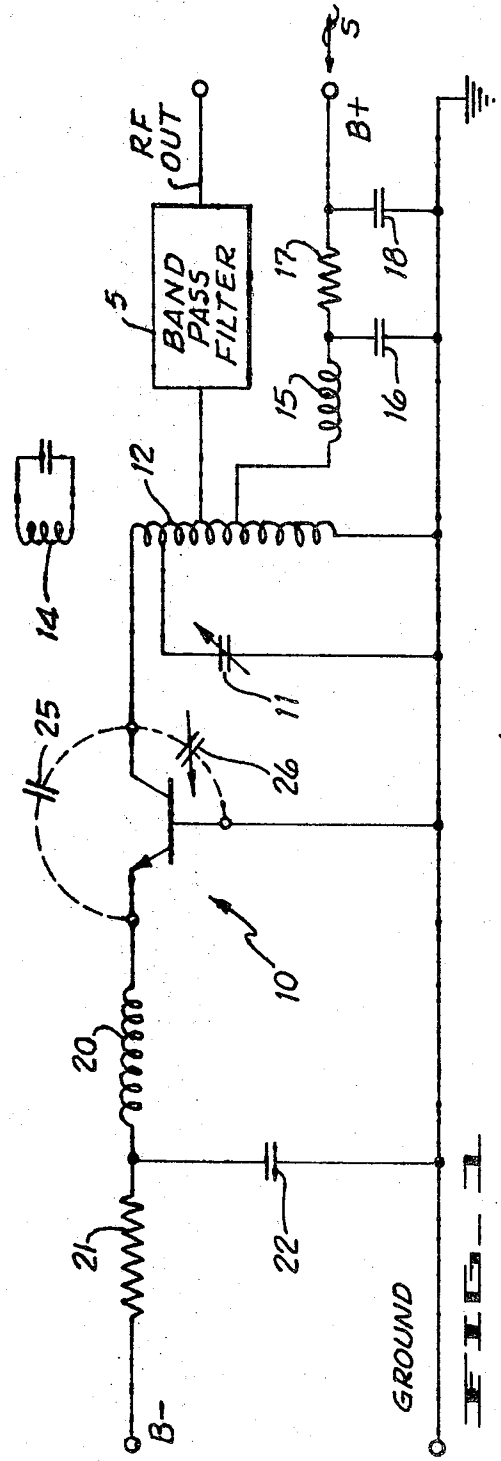
Figure 2:
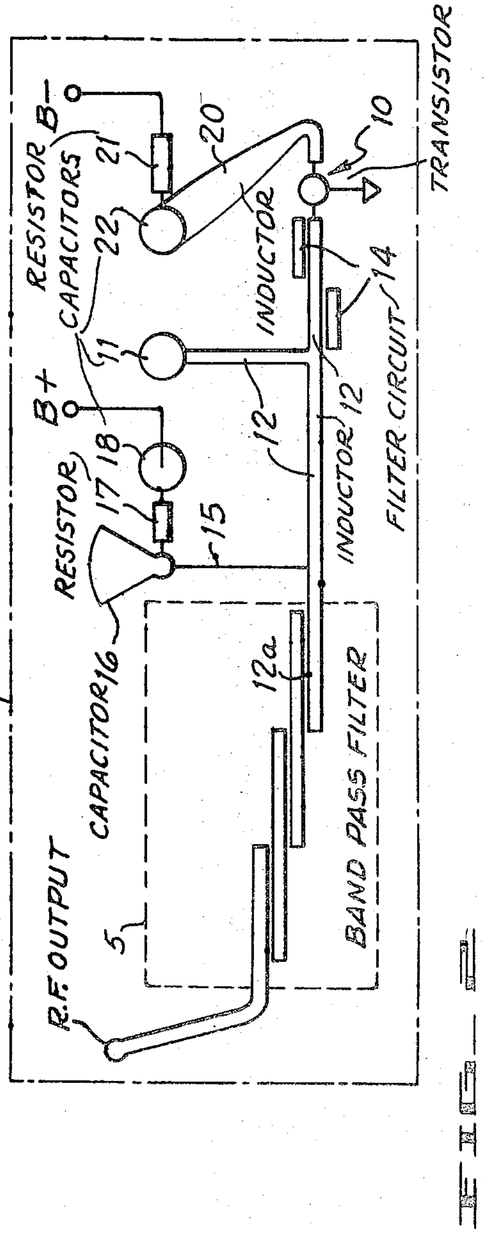

This object and other objects and features of the present invention will become apparent to the persons skilled in the art after a careful perusal of the following specification and drawings of which:

FIG. 1 is a schematic representation of the voltage controlled oscillator of the present invention, and FIG. 2 shows the voltage controlled oscillator of the present invention mounted in a strip transmission line resonator circuit in accordance with the present invention.

Referring now to the schematic diagram of the voltage controlled oscillator shown in FIG. 1, a transistor 10 is shown having its base terminal connected to ground. The collector of transistor 10 is connected to a tuned circuit comprising a variable capacitor 11 and an inductor 12.

A bandpass filter 5 is connected on one end to inductor 12. The output of bandpass filter 5 is connected generally to a power amplifier (not shown), for example, a traveling wave tube. A tuned circuit 14 is inductively coupled to inductor 12.

A suitable voltage soure B+ is provided for the circuit through a damping and decoupling network comprising resistor 17 and capacitor 18. The decoupling network is connected to an inductor 15 which is in turn connected to the collector of transistor 10 through inductance 12. A bypass capacitor 16 is provided at the junction of inductor 15 and resistor 17.

A suitable negative voltage source is provided to the emitter of transistor 10 through a biasing resistor 21 and inductor 20 which is connected to the emitter of transistor 10. The junction of inductor 20 and resistor 21 is connected to ground through a capacitor 22.

In use, transistor 10 operates as a self-excited oscillator whose frequency of oscillation $F_1$ is determined by the tuning circuit comprising capacitor 11 and inductor 12. Suitable feedback between the collector and emitter of transistor 10 is provided by the internal capacitance of the transistor shown (in phantom) as capacitor 25. A suitable value is chosen for inductor 20 in order to sustain oscillations for the entire circuit.

The operating frequency of the oscillator circuit is varied by adjusting tuning capacitor 11. The junction capacitance existing between the collector and the base of the transistor 10 shown (in phantom) as capacitor 26, also affects the frequency of oscillation as is determined by the voltage between the collector and base of transistor 10. The circuit will oscillate when the proper B+ and B— voltages are applied to the collector and emitter of transistor 10.

Assuming that the proper B+ and B— voltages are applied to the collector and emitter circuits, the oscillator will begin operating, at, for example, a selected frequency of oscillation of 1.15 gHz. The junction capacitance 26 between the base and collector of transistor 10 will be voltage dependent because of the reverse bias applied to the collector base junction. This voltage dependence, or nonlinearity, will cause harmonics of the1.15 gHz. operating frequency to be generated. Bandpass filter 5 is tuned to the second harmonic frequency, 2.3 gHz. in order to obtain the desired output frequency. The output frequency from bandpass filter 5 would then be coupled to any desired power amplifier (not shown), for example, a traveling wave tube. Tuned circuit 14 is provided to serve as a third harmonic frequency trap to suppress undesired harmonics of the oscillator.

Modulation may be accomplished by varying the collector voltage with a modulating signals. Therefore, the filter network comprising inductor 15, resistor 17 and capacitor 16 and 18 must be of such a value that RF will be decoupled from the power source yet permit a chosen modulating signal to pass to the collector of transistor 10. Capacitor 16 must provide bypass capacitance for the frequency of oscillation and its harmonics, but provide negligable capcitance at much lower frequencies where spurious oscillations might otherwise occur. The relatively simple method of modulating the oscillator by merely varying the collector B+ voltage with a modulating signal eliminates the need for more complicated means of frequency modulation. Current through the transistor 10 is determinde by the chosen value of biasing resistor 21 and the value of the B— voltage.

Since the expected frequency of operation of the voltage controlled oscillator is extremely high, in the order of 2.2 to 2.3 gHz., lumped components such as indicated in schematic diagram of FIG. 1 cannot be used. Instead, a distributed constant circuit realized in strip line is used in the preferred embodiment. Strip line circuits as is known, are generally made from etched circuits of copper. The etched circuits are mounted on a Teflon-fiber glass circuit board. FIG. 2 shows a voltage controlled oscillator mounted in a strip line resonator circuit. Transistor 10 is selected to have an operating frequency in the gHz., region and should have enough output power to drive a traveling wave tube. It is expected that the following circuit elements would be standard discreet components mounted on the circuit boards in the conventional manner; transistor 10, capacitor 11, resistor 17, capacitor 18, resistor 21 and capacitor 22. The remaining components of the circuit are constructed using solid dielectric strip-line techniques.

It is important to notice the position and shape of the various components made from strip-line techniques. For example, inductor 12 actually extends from transistor 10 into bandpass filter 5, with a branch extending up to connect to capacitor 11. αhis is because inductor 12 serves two functions. First, it must cooperate with capacitor 11 to resonate at the fundamental frequency of the voltage controlled oscillator, and second, stub 12*a*, extending into bandpass filter 5 must couple the 2nd harmonic of the VCO into bandpass filter 5, and thus becomes a part of the filter.

Flter circuit 14, which comprises 2 short stubs positioned on either side of inductor 12, should be located as close as possible to transistor 10. Since the function of filter circuit 14 is to suppress 3rd harmonic oscillations from the VCO, only by locating filter circuit 14 before the circuit branches out can the 3rd harmonics be controlled effectively.

Resistor 17, connected between capacitors 16 and 18, is buried in the surface of the transmission line to dampen out resonances at low frequencies in the voltage supply circuit. If resistor 17 were mounted on the circuit board in normal fashion, resonance circuits would be formed between relatively large capacitor 18 and the lead wires of an externally mounted resistor.

What is claimed is:

1. A solid state wide band microwave voltage controlled oscillator having an RF output terminal comprising: a transistor, said transistor including a base terminal, a collector terminal and an emitter terminal; a tuned circuit operably connected to said collector; a bandpass filter operably connected between said tuned circuit and said RF output terminal; a tuned network operably connected to said tuned circuit; a positive voltage supply operably connected to said collector terminal through said tuned network; a negative voltage source operably connected to said emitter; and means for varying said positive voltage supply with a modulating signal to modulate said voltage controlled oscillator.

2. The solid state wide band microwave voltage controlled oscillator according to claim 1 wherein a portion of said oscillator including said bandpass filter forms a strip-transmission line resonator circuit, and wherein said transistor is mounted in said strip-transmission line resonator circuit.

3. The solid state wide band microwave voltage controlled oscillator according to claim 1 whereby said tuned circuit comprises a tuning capacitor and a tuning inductor operably connected to said collector, said tuned network comprises a second inductor operably connected to said tuning inductor, a suppressor resistor operably connected to said second inductor, a first bypass capacitor operably connected to the junction of said second inductor and said suppressor resistor, and a decoupling capacitor operably connected to said suppressor resistor.

4. The solid state wide band microwave voltage controlled oscillator according to claim 3 further including a frequency trap network inductively coupled to said tuning inductor.

5. The solid state wide band microwave voltage controlled oscillator according to claim 4 further including an emitter inductor operably connected to the emitter of said transistor, a biasing resistor operably connected between said negative votlage source and said emitter inductor and a second bypass capacitor operably connected to the junction of said biasing resistor and said emitter capacitor.

6. The solid state wide band microwave voltage controlled oscillator according to claim 5 wherein said tuning inductor, said second inductor, said first bypass capacitors, said bandpass filter and said emitter inductor constitute portions of a strip-transmission line resonant circuit, and wherein said transistor, said tuning capacitor, said suppressor resistor, said decoupling capacitor, said biasing resistor and said second bypass capacitor constitute discrete components mounted in said strip-transmission line resonator circuit.

References Cited

UNITED STATES PATENTS

| | | | |
|---|---|---|---|
| 2,549,855 | 4/1951 | Salzberg | 332—60 |
| 2,644,925 | 7/1953 | Koros. | |
| 2,657,360 | 10/1953 | Wallace | 331—117 X |
| 3,271,698 | 9/1966 | Adams | 332—16 X |
| 3,377,567 | 4/1968 | Kruse et al. | 331—117 |

FOREIGN PATENTS

| | | |
|---|---|---|
| 610,865 | 10/1948 | Great Britain. |

ALFRED L. BRODY, Primary Examiner

U.S. Cl. X.R.

307—295; 331—117